United States Patent
Cruz-Hernandez et al.

(10) Patent No.: US 8,576,174 B2
(45) Date of Patent: Nov. 5, 2013

(54) HAPTIC DEVICES HAVING MULTIPLE OPERATIONAL MODES INCLUDING AT LEAST ONE RESONANT MODE

(75) Inventors: Juan Manuel Cruz-Hernandez, Montreal (CA); Danny A. Grant, Laval (CA); Vincent Hayward, Montreal (CA)

(73) Assignee: Immersion Corporation, San Jose, CA (US)

( * ) Notice: Subject to any disclaimer, the term of this patent is extended or adjusted under 35 U.S.C. 154(b) by 1635 days.

(21) Appl. No.: 12/075,933

(22) Filed: Mar. 14, 2008

(65) Prior Publication Data
US 2008/0170037 A1 Jul. 17, 2008

Related U.S. Application Data

(63) Continuation of application No. 10/792,279, filed on Mar. 4, 2004, now Pat. No. 7,369,115, which is a continuation-in-part of application No. 10/301,809, filed on Nov. 22, 2002, now Pat. No. 7,161,580.

(60) Provisional application No. 60/375,930, filed on Apr. 25, 2002.

(51) Int. Cl.
*G09G 5/00* (2006.01)
*G06F 3/02* (2006.01)

(52) U.S. Cl.
USPC ........... 345/169; 345/156; 715/700; 715/701; 715/702

(58) Field of Classification Search
USPC ............................ 345/156, 169; 715/700–702
See application file for complete search history.

(56) References Cited

U.S. PATENT DOCUMENTS 2,972,140 A 2/1961 Hirsh
3,157,853 A 11/1964 Hirsh
(Continued)

FOREIGN PATENT DOCUMENTS

EP 0349086 1/1990
GB 1088741 A1 10/1967
(Continued)

OTHER PUBLICATIONS

Adelstein, B., et al., "Design and Implementation of a Force Reflecting Manipulandum for Manual Control research," DSC-vol. 42, Advances in Robotics, ASMA, Jun. 1992, pp. 1-12.
(Continued)

*Primary Examiner* — William Boddie
*Assistant Examiner* — Alecia D English
(74) *Attorney, Agent, or Firm* — Pillsbury Winthrop Shaw Pittman LLP

(57) ABSTRACT

An electronic device and method of operating comprises a housing; a base coupled to the housing; and an electro-mechanical transducer coupled to the base, the electro-mechanical transducer configured to operate in a resonant mode and output a haptic effect upon receiving a drive signal at a predetermined drive frequency. In an embodiment, the electro-mechanical transducer further comprises a plurality of electro-mechanical transducers, each electro-mechanical transducer configured to operate in its respective resonant mode and output a respective haptic effect upon receiving a drive signal having a predetermined drive frequency. Alternatively or additionally, the electro-mechanical transducer further comprises a plurality of spaced apart electro-mechanical devices coupled thereto in a serial fashion between a first end proximal to the base and a second end distal to the base.

20 Claims, 8 Drawing Sheets

(56) References Cited

U.S. PATENT DOCUMENTS

| | | |
|---|---|---|
| 3,220,121 A | 11/1965 | Cutler |
| 3,497,668 A | 2/1970 | Hirsh |
| 3,517,446 A | 6/1970 | Corlyon et al. |
| 3,623,064 A | 11/1971 | Kagan |
| 3,902,687 A | 9/1975 | Hightower |
| 3,903,614 A | 9/1975 | Diamond et al. |
| 3,911,416 A | 10/1975 | Feder |
| 3,919,691 A | 11/1975 | Noll |
| 4,127,752 A | 11/1978 | Lowthorp |
| 4,160,508 A | 7/1979 | Salisbury, Jr. |
| 4,236,325 A | 12/1980 | Hall et al. |
| 4,262,240 A | 4/1981 | Arai |
| 4,262,549 A | 4/1981 | Schwellenbach |
| 4,333,070 A | 6/1982 | Barnes |
| 4,334,280 A | 6/1982 | McDonald |
| 4,355,348 A | 10/1982 | Williams |
| 4,382,166 A | 5/1983 | Kim |
| 4,414,984 A | 11/1983 | Zarudiansky |
| 4,459,440 A | 7/1984 | Wiczer |
| 4,464,117 A | 8/1984 | Foerst |
| 4,473,725 A | 9/1984 | Kim |
| 4,484,191 A | 11/1984 | Vavra |
| 4,490,841 A | 12/1984 | Chaplin et al. |
| 4,513,235 A | 4/1985 | Acklam et al. |
| 4,581,491 A | 4/1986 | Boothroyd |
| 4,599,070 A | 7/1986 | Hladky et al. |
| 4,600,854 A | 7/1986 | Bednorz et al. |
| 4,706,294 A | 11/1987 | Ouchida |
| 4,708,656 A | 11/1987 | de Vries et al. |
| 4,713,007 A | 12/1987 | Alban |
| 4,731,603 A | 3/1988 | MacRae et al. |
| 4,768,412 A | 9/1988 | Sanderson |
| 4,794,392 A | 12/1988 | Selinko |
| 4,795,296 A | 1/1989 | Jau |
| 4,868,549 A | 9/1989 | Affinito et al. |
| 4,885,565 A | 12/1989 | Embach |
| 4,891,764 A | 1/1990 | McIntosh |
| 4,930,770 A | 6/1990 | Baker |
| 4,934,694 A | 6/1990 | McIntosh |
| 5,019,761 A | 5/1991 | Kraft |
| 5,022,384 A | 6/1991 | Freels et al. |
| 5,022,407 A | 6/1991 | Horch et al. |
| 5,035,242 A | 7/1991 | Franklin et al. |
| 5,038,089 A | 8/1991 | Szakaly |
| 5,078,152 A | 1/1992 | Bond et al. |
| 5,103,404 A | 4/1992 | McIntosh |
| 5,107,262 A | 4/1992 | Cadoz et al. |
| 5,146,566 A | 9/1992 | Hollis, Jr. et al. |
| 5,165,897 A | 11/1992 | Johnson |
| 5,172,092 A | 12/1992 | Nguyen et al. |
| 5,175,459 A | 12/1992 | Danial et al. |
| 5,184,310 A | 2/1993 | Takenouchi |
| 5,184,319 A | 2/1993 | Kramer |
| 5,186,629 A | 2/1993 | Rohen |
| 5,186,695 A | 2/1993 | Mangseth et al. |
| 5,203,563 A | 4/1993 | Loper, III |
| 5,212,473 A | 5/1993 | Louis |
| 5,227,594 A | 7/1993 | Russo |
| 5,240,417 A | 8/1993 | Smithson et al. |
| 5,245,245 A | 9/1993 | Goldenberg |
| 5,261,291 A | 11/1993 | Schoch et al. |
| 5,271,290 A | 12/1993 | Fischer |
| 5,275,174 A | 1/1994 | Cook |
| 5,283,970 A | 2/1994 | Aigner |
| 5,296,871 A | 3/1994 | Paley |
| 5,299,810 A | 4/1994 | Pierce et al. |
| 5,309,140 A | 5/1994 | Everett, Jr. et al. |
| 5,334,027 A | 8/1994 | Wherlock |
| 5,334,893 A | 8/1994 | Oudet et al. |
| 5,354,162 A | 10/1994 | Burdea et al. |
| 5,388,992 A | 2/1995 | Franklin et al. |
| 5,389,849 A | 2/1995 | Asano et al. |
| 5,399,091 A | 3/1995 | Mitsumoto |
| 5,405,152 A | 4/1995 | Katanics et al. |
| 5,435,729 A | 7/1995 | Hildreth et al. |
| 5,436,622 A | 7/1995 | Gutman et al. |
| 5,437,607 A | 8/1995 | Taylor |
| 5,437,608 A | 8/1995 | Cutler |
| 5,438,529 A | 8/1995 | Rosenberg et al. |
| 5,440,183 A | 8/1995 | Denne |
| 5,456,341 A | 10/1995 | Garnjost et al. |
| 5,466,213 A | 11/1995 | Hogan et al. |
| 5,547,382 A | 8/1996 | Yamasaki et al. |
| 5,565,840 A | 10/1996 | Thorner et al. |
| 5,575,761 A | 11/1996 | Hanjianpour |
| 5,580,251 A | 12/1996 | Gilkes et al. |
| 5,583,478 A | 12/1996 | Renzi |
| 5,587,937 A | 12/1996 | Massie et al. |
| 5,589,828 A | 12/1996 | Armstrong |
| 5,619,180 A | 4/1997 | Mossimino et al. |
| 5,625,575 A | 4/1997 | Goyal et al. |
| 5,631,861 A | 5/1997 | Kramer |
| 5,643,087 A | 7/1997 | Marcus et al. |
| 5,650,704 A | 7/1997 | Pratt et al. |
| 5,661,446 A | 8/1997 | Anderson et al. |
| 5,669,818 A | 9/1997 | Thorner et al. |
| 5,684,722 A | 11/1997 | Thorner et al. |
| 5,689,285 A | 11/1997 | Asher |
| 5,690,582 A | 11/1997 | Ulrich et al. |
| 5,709,219 A | 1/1998 | Chen et al. |
| 5,714,978 A | 2/1998 | Yamanaka et al. |
| 5,734,236 A | 3/1998 | Motegi |
| 5,734,373 A | 3/1998 | Rosenberg et al. |
| 5,735,280 A | 4/1998 | Sherman et al. |
| 5,736,978 A | 4/1998 | Hasser et al. |
| 5,739,811 A | 4/1998 | Rosenberg et al. |
| 5,742,278 A | 4/1998 | Chen et al. |
| 5,754,023 A | 5/1998 | Roston et al. |
| 5,766,016 A | 6/1998 | Sinclair et al. |
| 5,781,172 A | 7/1998 | Engel et al. |
| 5,784,052 A | 7/1998 | Keyson |
| 5,785,630 A | 7/1998 | Bobick et al. |
| 5,790,108 A | 8/1998 | Salcudean et al. |
| 5,805,140 A | 9/1998 | Rosenberg et al. |
| 5,828,363 A | 10/1998 | Yaniger et al. |
| 5,842,162 A | 11/1998 | Fineberg |
| 5,857,986 A | 1/1999 | Moriyasu |
| 5,889,672 A | 3/1999 | Schuler et al. |
| 5,894,263 A | 4/1999 | Shimakawa et al. |
| 5,896,076 A | 4/1999 | van Namen |
| 5,897,437 A | 4/1999 | Nishiumi et al. |
| 5,907,212 A | 5/1999 | Okada |
| 5,914,705 A | 6/1999 | Johnson et al. |
| 5,943,624 A * | 8/1999 | Fox et al. .................. 455/556.1 |
| 5,945,772 A | 8/1999 | Macnak et al. |
| 5,952,806 A | 9/1999 | Muramatsu |
| 5,973,670 A | 10/1999 | Barber et al. |
| 5,984,880 A | 11/1999 | Lander et al. |
| 5,986,643 A | 11/1999 | Harvill et al. |
| 6,001,014 A | 12/1999 | Ogata et al. |
| 6,004,134 A | 12/1999 | Marcus et al. |
| 6,020,876 A | 2/2000 | Rosenberg et al. |
| 6,037,927 A | 3/2000 | Rosenberg |
| 6,044,646 A | 4/2000 | Silverbrook |
| 6,046,726 A | 4/2000 | Keyson |
| 6,057,753 A | 5/2000 | Myers |
| 6,078,126 A | 6/2000 | Rollins et al. |
| 6,088,017 A | 7/2000 | Tremblay et al. |
| 6,088,019 A | 7/2000 | Rosenberg |
| 6,104,158 A | 8/2000 | Jacobus et al. |
| 6,111,577 A | 8/2000 | Zilles et al. |
| 6,160,489 A | 12/2000 | Perry et al. |
| 6,181,318 B1 | 1/2001 | Lim |
| 6,184,868 B1 | 2/2001 | Shahoian et al. |
| 6,198,206 B1 | 3/2001 | Saarmaa et al. |
| 6,211,861 B1 * | 4/2001 | Rosenberg et al. ........... 345/163 |
| 6,216,059 B1 | 4/2001 | Ierymenko |
| 6,232,697 B1 | 5/2001 | Mizumoto |
| 6,256,011 B1 | 7/2001 | Culver |
| 6,275,213 B1 | 8/2001 | Tremblay et al. |
| RE37,374 E * | 9/2001 | Roston et al. .................. 318/561 |
| 6,285,351 B1 | 9/2001 | Chang et al. |
| 6,307,285 B1 * | 10/2001 | Delson et al. .................. 310/14 |
| 6,317,032 B1 | 11/2001 | Oishi |

(56) References Cited

U.S. PATENT DOCUMENTS

| | | | |
|---|---|---|---|
| 6,414,607 | B1 | 7/2002 | Gonring et al. |
| 6,422,941 | B1 * | 7/2002 | Thorner et al. ............... 463/30 |
| 6,424,333 | B1 | 7/2002 | Tremblay et al. |
| 6,429,849 | B1 | 8/2002 | An et al. |
| 6,433,771 | B1 | 8/2002 | Yocum et al. |
| 6,437,771 | B1 | 8/2002 | Rosenberg et al. |
| 6,456,024 | B1 | 9/2002 | Schmider et al. |
| 6,531,998 | B1 | 3/2003 | Gordon |
| 6,585,595 | B1 | 7/2003 | Soma |
| 6,639,581 | B1 | 10/2003 | Moore et al. |
| 6,655,211 | B1 * | 12/2003 | Schmid et al. ............ 73/514.34 |
| 6,693,516 | B1 * | 2/2004 | Hayward ................... 340/407.1 |
| 6,693,622 | B1 | 2/2004 | Shahoian et al. |
| 6,697,043 | B1 | 2/2004 | Shahoian |
| 6,704,001 | B1 | 3/2004 | Schena et al. |
| 6,717,573 | B1 | 4/2004 | Shahoian et al. |
| 6,724,128 | B2 * | 4/2004 | Cheng et al. ................. 310/328 |
| 6,731,270 | B2 * | 5/2004 | Tosaya ......................... 345/173 |
| 6,885,876 | B2 | 4/2005 | Aaltonen et al. |
| 6,927,756 | B1 * | 8/2005 | Hauck .......................... 345/156 |
| 6,963,762 | B2 | 11/2005 | Kaaresoja et al. |
| 7,161,580 | B2 | 1/2007 | Bailey et al. |
| 2001/0026264 | A1 | 10/2001 | Rosenberg |
| 2001/0035722 | A1 | 11/2001 | Audren et al. |
| 2002/0030663 | A1 | 3/2002 | Tierling |
| 2002/0070638 | A1 | 6/2002 | Perkins |
| 2002/0080112 | A1 | 6/2002 | Braun et al. |
| 2002/0142701 | A1 | 10/2002 | Rosenberg |
| 2002/0159336 | A1 | 10/2002 | Brown et al. |
| 2003/0006892 | A1 | 1/2003 | Church |
| 2003/0067440 | A1 | 4/2003 | Rank |
| 2003/0076298 | A1 | 4/2003 | Rosenberg |

FOREIGN PATENT DOCUMENTS

| | | |
|---|---|---|
| JP | 61032487 | 2/1986 |
| JP | H2-185278 | 7/1990 |
| JP | H4-8381 | 1/1992 |
| JP | H5-192449 | 8/1993 |
| JP | H7-24147 | 1/1995 |
| JP | 09231000 | 9/1997 |
| JP | 11009838 | 1/1999 |
| JP | 2002044200 | 2/2002 |
| WO | WO 92/00559 A1 | 1/1992 |
| WO | WO 92/19018 | 10/1992 |
| WO | WO 93/08517 | 4/1993 |
| WO | WO 00/39783 | 7/2000 |
| WO | WO 01/03105 A1 | 1/2001 |
| WO | WO 01/13354 A1 | 2/2001 |
| WO | WO 01/24158 A1 | 4/2001 |

OTHER PUBLICATIONS

Aukstakalnis, S. et al., "Silicon Mirage: The Art and Science of Virtual Reality," Berkeley, CA, Peach Pit Press, 1992, pp. 129-180.

Baigre, S., "Electric Control Loading—A Low Cost, High Performance Alternative," Proceedings of the 12th Interservice/Industry Training Systems Conference, Orlando, Florida, Nov. 1990, pp. 247-254.

Bejczy, Antal K., et al., "Generalization of Bilateral Force-Reflecting Control of Manipulators," Proceedings Of Fourth CISM—IFToMM Symposium on Theory and Practice of Robots and Manipulators, Zaborow, Poland, Sep. 8-12, 1981, 14 pages.

Bejczy, Antal K. et al., "Universal Computer Control System (UCCS) For Space Telerobots," Proceedings 1987 IEEE International Conference On Robotics and Automation, vol. 1, 1987, pp. 318-324.

Bejczy, A. K. et al., "A Laboratory Breadboard System for Dual-Arm Teleoperation," Third Annual Workshop on Space Operations Automation and Robotics (Soar '89), Jul. 1989, 13 pages.

Bejczy, A. K., "Sensors, Controls, and Man-Machine Interface for Advanced Teleoperation," Science, vol. 208, No. 4450, 1980, pp. 1327-1335.

Bejczy, A. K. et al., "Kinesthetic Coupling Between Operator and Remote Manipulator," International Computer Technology Conference, The American Society of Mechanical Engineers, San Francisco, CA, Aug. 12-15, 1980, 9 pages.

Bliss, J. C., "Optical-to-tactile Image Conversion for the Blind," IEEE Transactions on Man-Machine Systems, vol. MMS-11, No. 1, 1970, pp. 58-65.

Brooks et al., "Hand Controllers for Teleoperation—A State-of-the-Art Technology Survey and Evaluation," JPL Publication 85-11; NASA-CR-175890; N85-28559, Mar. 1, 1985, pp. 1-84.

Burder et al., "Distributed Virtual Force Feedback," Lecture Notes for Workshopon Force Display in Virtual Environments and its Application to Robotic Teleoperation, IEEE Conference on Robotics and Automation, May 1993, pp. 25-44.

Calder, B., "Design of a force-feedback touch-inducing actuator for teleoperator robot control," Thesis (B.S.)—Massachusetts Institute of Technology, Dept. of Mechanical Engineering, Cambridge, MA, 1983.

Caldwell, D., et al, "Enhanced Tactile Feedback (Tele-Taction) Using a Multi-Functional Sensory System," Proceedings of the 1993 IEEE International Conference on Robotics and Automation: vol. 1, Atlanta, GA, IEEE Computer Society Press, 1993, pp. 955-960.

Lake, Sir Launcelot, "Cyberman from Logitech," at http://www.ibiblio.org/GameBytes/Issue21/greviews/cyberman.html, 1994.

Eberhardt, S. P. et al., "OMAR—A Haptic Display for Speech Perception by Deaf and Deaf-Blind Individuals," IEEE Virtual Reality Annual International Symposium, Seattle, WA, Sep. 1993, pp. 195-201.

Eberhardt, S. P. et al., "Inducing Dynamic Haptic Perception by the Hand: System Description and Some Results," Proceedings of ASME Dynamic Systems and Control, vol. DSC-55-1, No. 1, 1994, pp. 345-351.

Gobel, M., et al., "Tactile Feedback Applied to Computer Mice," International Journal of Human-Computer Interaction, vol. 7, No. 1, 1995, pp. 1-24.

Gotow, J.K. et al, "Controlled Impedance Test Apparatus for Studying Human Interpretation of Kinesthetic Feedback," Proceedings of the 1989 American Control Conference, Pittsburgh, PA, Jun. 21-23, 1989, pp. 332-337.

Howe, R. D., "A Force-Reflecting Teleoperated Hand System for the Study of Tactile Sensing in Precision Manipulation," Proceedings of the 1992 IEEE International Conference on Robotics and Automation, vol. 2, 1992, pp. 1321-1326.

IBM Corporation, "Mouse Ball-Actuating Device with Force and Tactile Feedback," vol. 32, IBM Technical Disclosure Bulletin No. 9B, Feb. 1990, pp. 230-235.

Iwata, H., "Pen-based Haptic Virtual Environment," in IEEE Annual Virtual Reality International Symposium, pp. 287-292, IEEE Service Center, (Seattle, WA, USA), 0-7803-1363-1/93 IEEE, 1993.

Jackson, K. M., "Linearity of Radio-Frequency Transducers," Medical and Biological Engineering and Computer, vol. 15, Jul. 1977, pp. 446-449.

Jacobsen, S.C. et al., "High Performance, Dextrous Telerobotic Manipulator With Force Reflection," Intervention/ROV '91 Conference & Exposition, Hollywood, Florida, May 21-23, 1991, pp. 213-218.

Johnson, D. A., "Shape-Memory Alloy Tactical Feedback Actuator," Tini Allow Company, Inc., Aug. 1990, 2 pages, pp. i-33.

Jones, L. et al., "A Perceptual Analysis of Stiffness," Springer International, Experimental Brain Research, vol. 79, No. 1, 1990, pp. 151-156.

Kaczmarek, K. A. et al. "Tactile Displays," Virtual Environments and Advanced Interface Design, Chapter 9 , New York: Oxford University Press, 1995, pp. 349-414.

Kashani, R., "Tuned Mass Dampers and Vibration Absorbers," www.deicon.com, downloaded Apr. 2006, pp. 1-5.

Kontarinis, D., et al., "Display of High-Frequency Tactile Information to Teleoperators," Telemanipulator Technology and Space Telerobotics, Won S. Kim, Editor, Proc. SPIE vol. 2057, Sep. 7-9, 1993, pp. 40-50.

Kontarinis, D., et al., "Tactile Display of Vibratory Information in Teleoperation and Virtual Environments," PRESENCE, vol. 4, No. 4, 1995, pp. 387-402.

(56) References Cited

OTHER PUBLICATIONS

Logitech Developer Support, "Logitech Cyberman SWIFT Supplement," Cyberman Technical Specification, Revision: 1.0, Logitech Inc., Fremont, CA, Apr. 1994, pp. iii-29.

Malatkar, P., "Nonlinear Vibrations of Cantilever Beams and Plates," Dissertation to the Faculty of the Virginia Polytechnic Institute and State University, Jul. 2003, pp. 1-145.

Marcus, B., "Touch Feedback in Surgery," Official Proceedings of Virtual Reality and Medicine The Cutting Edge, Sep. 1994, pp. 96-97.

McAffee, D. A. et al, "Teleoperator Subsystem/Telerobot Demonstrator: Force Reflecting Hand Controller Equipment Manual," JPL D-5172, Jet Propulsion Laboratory, California Institute of Technology, Pasadena, CA, Jan. 1988, pp. 1-C36.

Minsky, M., "Computational Haptics: The Sandpaper System for Synthesizing Texture for a Force-Feedback Display," Ph.D. Dissertation, Massachusetts Institute of Technology, Cambridge, MA, Jun. 1995.

Noll, A., "Man-Machine Tactile," SID Journal, The Official Journal of the Society for Information Display, vol. 1, No. 2, Jul./Aug. 1972, pp. 5-11, 30.

Ouhyoung, M., et al., "The Development of A Low-Cost Force Feedback Joystick and Its Use in the Virtual Environment," Proceedings of the Third Pacific Conference on Computer Graphics and Applications, Pacific Graphics, '95, Seoul, Korea, Aug. 21-24, 1995, pp. 309-319.

Ouhyoung, M., "Force Display in Molecular Docking," Doctoral Dissertation, University of North Carolina at Chapel Hill, UMI Order No. 9034744, 1190, pp. 1-369.

Ouhyoung, M. et al., "A Low-Cost Force Feedback Joystick and Its Use in PC Video Games," IEEE Transactions on Consumer Electronics, vol. 41, No. 3, Aug. 1995, pp. 787-794.

Patrick, N., "Design, Construction, and Testing of a Fingertip Tactile Display for Interaction with Virtual and Remote Environments," Master of Science Thesis, Massachusetts Institute of Technology, Cambridge, MA, Aug. 1990.

Patrick, N. et al., "Design and Testing of A Non-reactive, Fingertip, Tactile Display for Interaction with Remote Environments," Cooperative Intelligent Robotics in Space, Proceedings of the SPIE, vol. 1387, 1990, pp. 215-222.

Pimentel, K. et al., "Virtual Reality: Through The New Looking Glass," McGraw-Hill Inc., New York, NY, chapters 3-8, 1995, pp. 41-202.

Rabinowitz, W.M. et al., "Multidimensional Tactile Displays: Identification of Vibratory Intensity, Frequency, and Contactor Area," Journal of Acoustic Society of America, vol. 82, No. 4, Oct. 1987, pp. 1243-1252.

Rosenberg, L. B., "Virtual Fixtures: Perceptual Overlays Enhance Operator Performance in Telepresence Tasks," PhD Dissertation, Dept. of Mechanical Engineering, Stanford University, Aug. 1994, pp. ii-214.

Russo, M. A., "The Design and Implementation of a Three Degree of Freedom Force Output Joystick," Dept. of Mechanical Engineering, MIT, May 1990, pp. 1-131.

Russo, M., et al., "Controlling Dissipative Magnetic Particle Brakes in Force Reflective Devices," DSC-vol. 42, Advances in Robotics, ASME 1992, pp. 63-70.

Technical Manual Overhaul Instructions With Parts Breakdown, Coaxial Control Shaker Part No. C-25502, Safe Flight Instrument Corporation, Revised Jul. 15, 1980, 23 pages.

"Component Maintenance Manual with Illustrated Parts list, Coaxial Control Shaker Part No. C-25502," Safe Flight Instrument Corporation, Revised Jan. 28, 2002, 3 pages.

Scannell, T., "Taking a Joystick Ride," vol. 9 Computer Currents No. 11, Boston Edition, Nov. 1994.

Shimoga K., "Finger Force and Touch Feedback Issues in Dexterous Telemanipulation", in: Proceedings Fourth Annual Conference on Intelligent Robotic Systems for Space Exploration, Rensselaer Polytechnique Institute, Troy, NY, Sep. 30-Oct. 1, 1992, pp. 159-178.

Snow et al., "Model-X Force-Reflecting-Hand-Controller", NT Control No. NPO-17851; JPL Case No. 7348, Jun. 1989, pp. 1-4 with 25 pages of attachments.

Stanley, M. et al., "Computer Simulation of Interacting Dynamic Mechanical Systems Using Distributed Memory Parallel Processors," DSC-vol. 42, Advances in Robotics, ASME 1992, pp. 55-61.

Tadros, A. H., "Control System Design for a Three Degree of Freedom Virtual Environment Simulator Using Motor/Brake Pair Actuators," Dept. of Mechanical Engineering, MIT Feb. 1990, pp. 2-88.

Terry, J. et al., "Tactile Feedback in a Computer Mouse", in: Proceedings of Fourteenth Annual Northeast Bioengineering Conference, University of New Hampshire, Mar. 10-11, 1988, pp. 146-149.

Voyles, R., et al., "Design of a Modular Tactile Sensor and Actuator Based on an Electrorheological Gel," in: Proceedings of the 1996 IEEE International Conference on Robotics and Automation, Minneapolis, MN, Apr. 1996, pp. 13-17.

Wiker, S. F., "Teletouch Display Development: Phase 1 Report," Naval Ocean Systems Center, Technical Report 1230, Jul. 1988, 66 pages.

Yamakita, M. et al., "Tele Virtual Reality of Dynamic Mechanical Model," Proceedings of the 1992 IEEE/RSJ International Conference on Intelligent Robots and Systems, Jul. 7-10, 1992, pp. 1103-1110.

Korean Office Action in Korean Application No. 10-2004-7016973, dated Dec. 19, 2009.

European Search Report in European Application No. 03724148, dated Mar. 5, 2010.

Chinese Office Action in Chinese Application No. 03809339.1, Feb. 15, 2008.

British Office Action in Great Britain Application No. GB0619155.5, dated Aug. 15, 2007.

Japanese Office Action in Japanese Application No. 2004-500279, dated Sep. 17, 2008.

Japanese Office Action in Japanese Application No. 2004-500279, dated Oct. 13, 2009.

International Search Report and Written Opinion in International Application No. PCT/2005/007215, dated Jun. 28, 2005.

International Search Report in International Application No. PCT/US03/12389, Aug. 11, 2003.

European Examination Report in European Application No. 03724148.6, dated Jun. 22, 2011.

\* cited by examiner

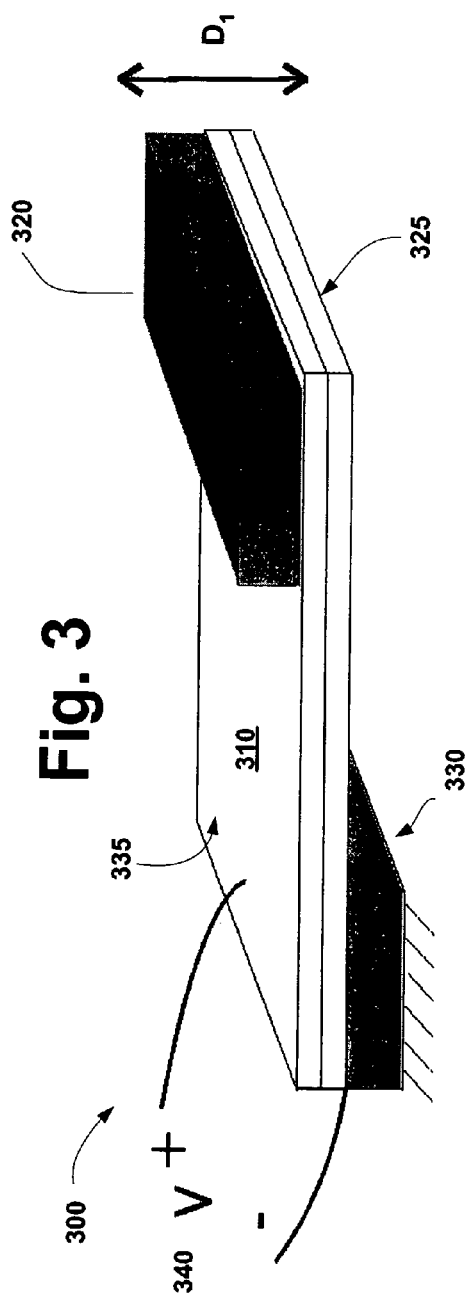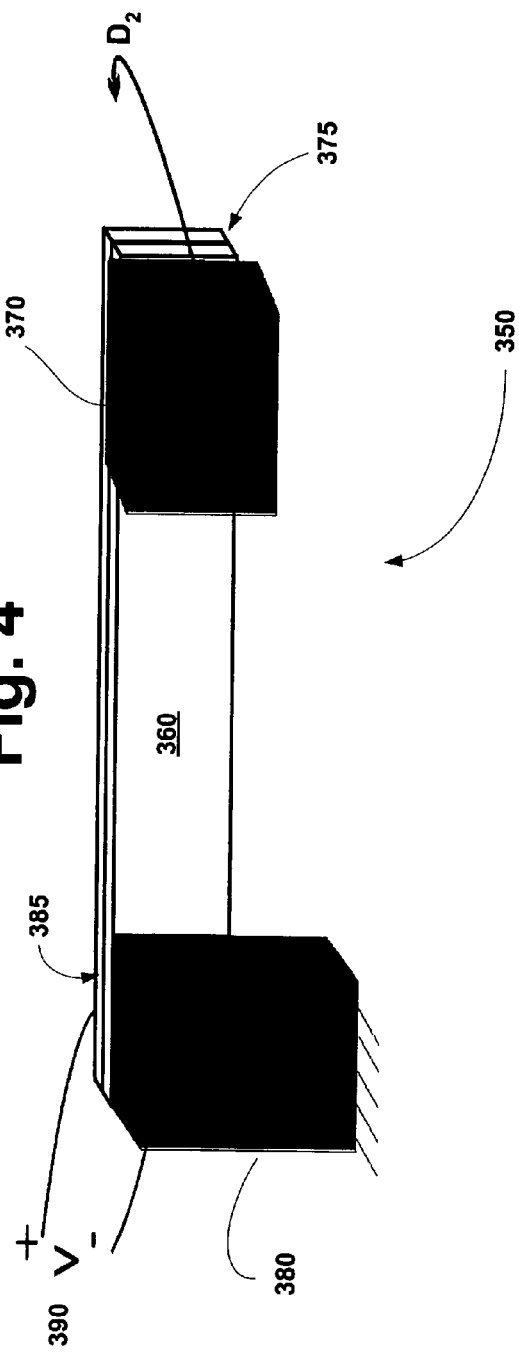

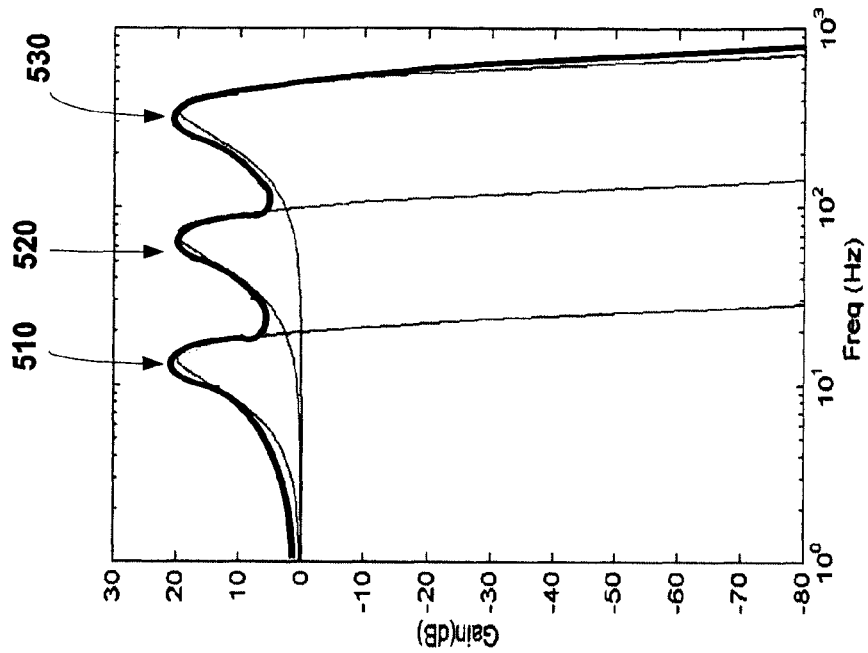
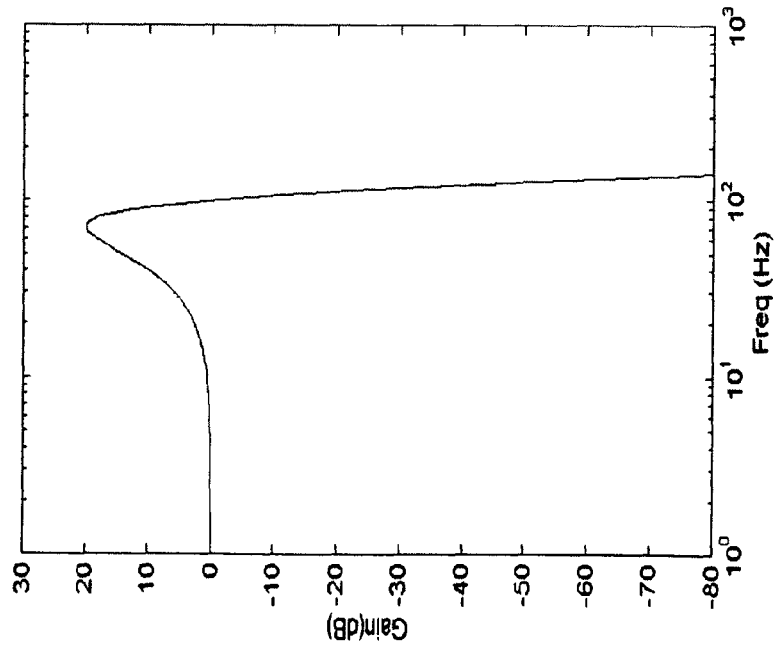

HAPTIC DEVICES HAVING MULTIPLE OPERATIONAL MODES INCLUDING AT LEAST ONE RESONANT MODE

CROSS-REFERENCE TO RELATED PATENT APPLICATIONS

This application is continuation of U.S. patent application Ser. No. 10/792,279, filed Mar. 4, 2004, entitled, "Haptic Devices Having Multiple Operational Modes Including At Least One Resonant Mode" which is a continuation-in-part and claims priority to U.S. patent application Ser. No. 10/301,809, entitled "Haptic Feedback Using Rotary Harmonic Moving Mass" and filed Nov. 22, 2002; and U.S. Patent Application No. 60/375,930, entitled "Haptic Feedback Using Rotary Harmonic Moving Mass" and filed Apr. 25, 2002.

TECHNICAL FIELD

The subject matter relates to a haptic feedback device having multiple operational modes including multiple resonant modes.

BACKGROUND

Generally, electro-mechanical transducers exhibit a level of power consumption that may be higher than desired. Furthermore, such electro-mechanical transducers may not be able to produce haptic feedback of a desired magnitude or bandwidth due to space constraints.

What is needed is an electro-mechanical transducer that is configured to produce vibrotactile feedback having a relatively high magnitude and/or an adjustable bandwidth. Additionally, it would be desirable to have an electro-mechanical transducer that can generate haptic feedback having relatively low energy consumption.

OVERVIEW

An electronic device and method of operating comprises a housing; a base coupled to the housing; and an electro-mechanical transducer coupled to the base, the electro-mechanical transducer configured to operate in a resonant mode and output a haptic effect upon receiving a drive signal at a predetermined drive frequency. In an embodiment, the electro-mechanical transducer further comprises a plurality of electro-mechanical transducers, each electro-mechanical transducer configured to operate in its respective resonant mode and output a respective haptic effect upon receiving a drive signal having a predetermined drive frequency. Alternatively or additionally, the electro-mechanical transducer further comprises a plurality of spaced apart electro-mechanical devices coupled thereto in a serial fashion between a first end proximal to the base and a second end distal to the base. In an embodiment, at least one mass is located a different predetermined distance from the base than a mass of another electro-mechanical device in the plurality. In an embodiment, at least one mass has a weight different than a mass of another electro-mechanical device in the plurality. In an embodiment, the drive frequency of the drive signal applied to two or more of the electro-mechanical transducers in the plurality has a substantially same value. In an embodiment, the drive frequency of the drive signal applied to at least one electro-mechanical transducer in the plurality is at a higher order of the resonant frequency of another electro-mechanical transducer in the plurality.

BRIEF DESCRIPTION OF THE DRAWINGS

FIG. 3 shows a perspective view of an electro-mechanical transducer according to an embodiment.

FIG. 4 shows a perspective view of an electro-mechanical transducer according to another embodiment.

FIG. 6 illustrates a plot of a gain profile for a single resonant mode output from single electro-mechanical transducer according to one embodiment.

FIG. 7 illustrates a plot of a gain profile for multiple resonant modes output by an electro-mechanical transducer according to an embodiment.

DETAILED DESCRIPTION

Figure 1:
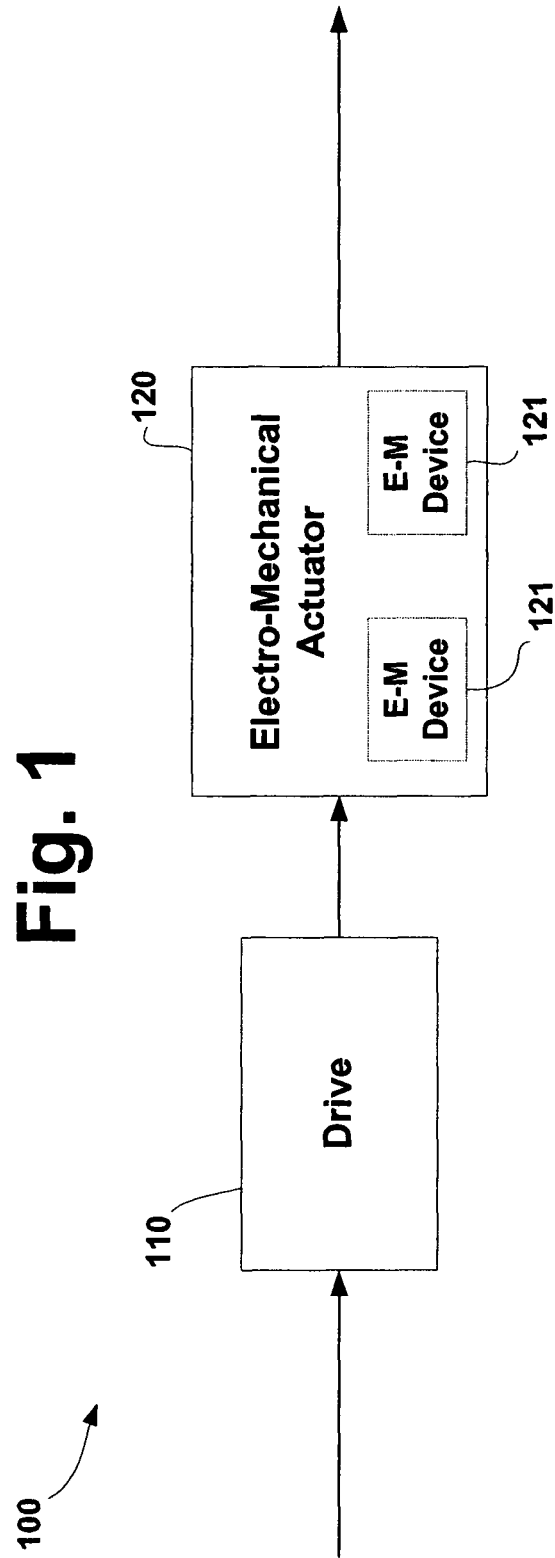
FIG. 1 is a system block diagram of an electro-mechanical transducer, according to an embodiment.

An apparatus comprises a signal source, a driver and an electro-mechanical transducer having a cantilever. The signal source is configured to output a haptic feedback signal. The driver is configured to receive the haptic feedback signal and output a drive signal. The electro-mechanical transducer has a cantilever and is configured to receive the drive signal. The electro-mechanical transducer is configured to have a set of operational modes. Each operational mode from the set of operational modes has at least one resonant mode from a set of resonant modes.

In one embodiment, electro-mechanical devices are used in an electro-mechanical transducer that is configured to output haptic feedback in an operational mode having one or more resonant modes. The electro-mechanical transducer is also configured to have multiple operational modes. Such a device can produce diverse and robust haptic feedback that can exhibit relatively low power consumption in a space-efficient manner. Although many embodiments described herein relate to using cantilevers as resonant structures, analogous devices are also possible. For example, such resonant structures can use acoustic cavities, membranes, mass-springs, wheel-torsional springs, and/or other structures capable of exhibiting mechanical resonance. Some embodiment, for example, can have a combination of different types of structure capable of exhibiting mechanical resonance.

As used herein, the term "operational mode" means a method or manner of functioning in a particular condition at a given time. For example, if a first electro-mechanical device is operating in a first resonant mode and a second electro-mechanical device is operating in a second resonant mode, the electro-mechanical transducer is operating collectively in, for example, a first operational mode. Alternatively, for example, if the first electro-mechanical device is operating in a third resonant mode, and the second electro-mechanical device is operating in a fourth resonant mode, the electro-mechanical transducer is operating collectively in a second operational mode. In another example, if the first electro-mechanical device is operating in a first resonant mode, and the second electro-mechanical device is not operating, the electro-mechanical transducer is operating collectively in a third operational mode. In other words, a given operation mode can be based on one electro-mechanical device operating in a resonant mode and another electro-mechanical device not being activated.

The term "resonant mode" means any mode of an electro-mechanical device operating in a frequency band centered around a resonant frequency. When an electro-mechanical device operates at or near a resonant frequency, several consequences occur. For example, when a transducer operates at or near a resonant frequency, the inertial term and the elastic terms substantially cancel. The power consumed by the actuator is then dedicated to balance dissipation (e.g. damping). If the dissipation is low, for example, in a cantilevered piezo-electric beam (i.e. a resonator with a high Q factor), the displacement is relatively large and limited by dissipative forces. In addition, if the mass that resonates is comparable to the mass of the structure to which the transducer is attached (e.g. case of a telephone), then the structure vibrates with a relatively large magnitude. Power lost during activation is in the dissipation. The remaining power is transmitted to the anatomy of the person with which the device is in contact.

The term "electro-mechanical device" as used herein, means an individual active component configured to provide haptic feedback. The term "active component" refers to a single component that provides a mechanical response to the application of an electrical signal. For example, for the embodiment illustrated in FIG. 5 and discussed below, a single length of, for example, piezoelectric material (for example, piezoelectric bar 410) and the associated mass (for example, mass 412) is referred to herein as the electro-mechanical device. In the example illustrated in FIG. 8 and discussed below, the electro-mechanical transducer includes only one electro-mechanical device.

The term "electro-mechanical transducer" means an apparatus having one or more electro-mechanical devices coupled to a mechanical ground. For example, in the illustrated in FIG. 5, the electro-mechanical transducer includes all three lengths of piezoelectric material, each having a mass coupled thereto. In the embodiment illustrated in FIG. 8, the electro-mechanical transducer includes piezoelectric bar 610 and the masses 620, 630, and 640.

An embodiment of an electro-mechanical transducer is illustrated in FIG. 1. An electro-mechanical transducer according to this embodiment includes a drive circuit 110 having an amplifier and includes an electro-mechanical transducer 120. The electro-mechanical transducer 120 includes one or more electro-mechanical (E-M) devices 121.

Drive 110 receives a haptic feedback signal and outputs a drive signal to electro-mechanical transducer 120. The haptic feedback signal may be based on a command from a microprocessor within, for example, a computer or a portable communications device (not shown). The electro-mechanical transducer 120 is configured to selectively operate in one of multiple possible operational modes at a given time. The operational mode of the electro-mechanical transducer 120 at a given time will depend, for example, on the characteristics of the drive signal received from driver 10. For a given operational mode, an electro-mechanical transducer can operate in multiple resonant modes as will be described in greater detail below. The one or more electro-mechanical devices 121 of electro-mechanical transducer 120 collectively output haptic feedback based on the drive signal, as illustrated in FIG. 7.

Figure 2:
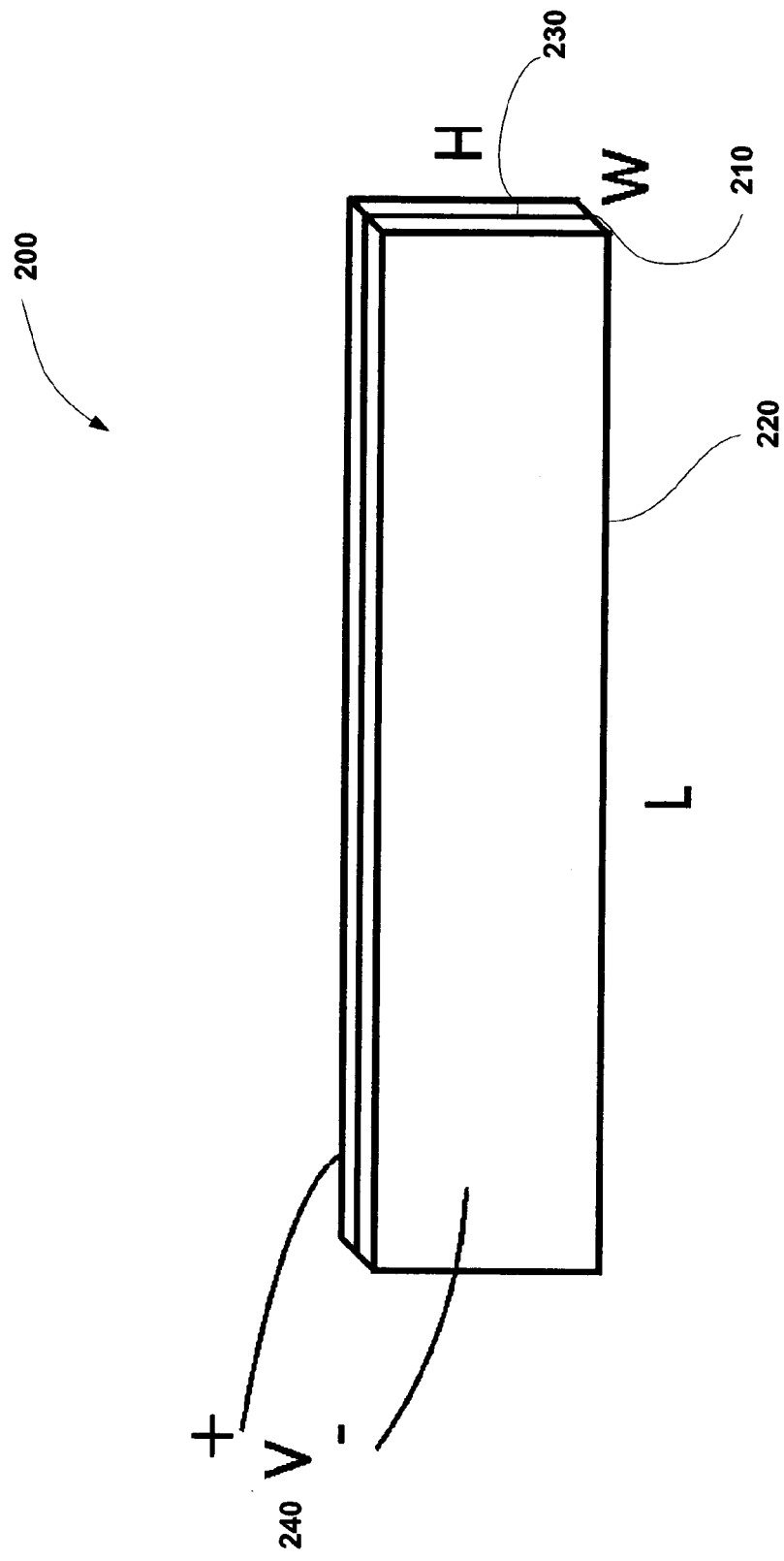
FIG. 2 shows a perspective view of an electro-mechanical device according to an embodiment.

FIG. 2 illustrates a piezoelectric bar in accordance with one embodiment. As described below in more detail, such a piezoelectric bar can be used as an electro-mechanical device within an electro-mechanical transducer.

The piezoelectric bar 200 is a bimorph piezoelectric device that is a two-layer bending motor having a length (L) 220 substantially larger than a width (W) 210. In one embodiment, the piezoelectric bar 200 has a width (W) 210 of approximately 0.6 mm, a length (L) 220 of approximately 25 mm and a height (H) 230 of approximately 5 mm. Alternatively, the piezoelectric bar can have any suitable dimensions depending on the desired use.

When a voltage 240 from, for example, a drive source (not shown), is applied across the piezoelectric bar 200, the piezoelectric bar 200 will flex. An appropriate level of voltage 240 to be applied to the piezoelectric bar 200 can be selected, based at least in part, on the material and the thickness of the material used to construct the piezoelectric bar 200.

The piezoelectric bar 200 can be driven near a resonant frequency. When the piezoelectric bar 200 is driven near a resonant frequency, impedance transformation may be obtained. Impedance transformation results in large mechanical displacements as described above.

An electro-mechanical device 300 that can be used in combination with other electro-mechanical devices to construct an electro-mechanical transducer is illustrated as FIG. 3. Multiple electro-mechanical devices 300 can be configured to operate in a selected operational mode from a set of possible operational modes, each operational mode having one or more resonant modes, as will be described in further detail with respect to FIG. 5.

The electro-mechanical device 300 illustrated in FIG. 3 includes a piezoelectric bar 310 having mass 320 coupled to an end portion 325 of the piezoelectric bar 310. A second end portion 335 of the piezoelectric bar 310 is coupled to a base member 330. Base member 330 acts as a mechanical ground and is configured to remain stationary relative to the movement of the piezoelectric bar 310.

The electro-mechanical device illustrated in FIG. 3 can operate as follows. A voltage 340 from a voltage source (not shown) can be applied to piezoelectric bar 310. The piezoelectric bar can be, for example, a bimorph piezoelectric device as described above in connection with FIG. 2. Voltage 340 causes piezoelectric bar 310 to flex in a first direction $D_1$. Voltage 340 can be modulated at a frequency, $f_d$, which is referred to herein as the drive frequency of the electro-mechanical device 300. As described above, the frequency $f_d$ can be selected such that the electro-mechanical device 300 operates near a resonant frequency the electro-mechanical device 300. Frequency $f_d$ is a function of the type of electro-mechanical device used in the electro-mechanical transducer, the dimensions of the electro-mechanical device (e.g., the length, width, height or thickness), and the position and weight of the masses in the electro-mechanical device.

When the drive frequency $f_d$ of the voltage 340 is such that the electro-mechanical device 300 operates near its resonant frequency, the electro-mechanical device 300 can produce a large vibration sensation relative to the voltage 340 applied to the electro-mechanical device 300.

Both the weight of mass 320 and the length of the piezoelectric bar 310 affect the amplitude of the displacement. Furthermore, the weight of mass 320 and the length of the piezoelectric bar 310 affect the resonant frequencies of the electro-mechanical device 300. Therefore, the particular resonant frequencies may be tailored by selecting the appropriate length of the piezoelectric bar and/or weight of the mass 320 for a desired resonant frequency. When voltage 340 is applied to the piezoelectric bar 310, the electro-mechanical device 300 will move in a plane oriented as vertical for the depiction in FIG. 3.

The embodiment illustrated in FIG. 4 is similar to that illustrated in FIG. 3. FIG. 4 shows an electro-mechanical device 350 including a piezoelectric bar 360 having mass 370 coupled to an end portion 375 of piezoelectric bar 360. The piezoelectric bar 360 has its second end portion 385 coupled to a base member 380, which acts as a ground and is configured to remain stationary with respect to movement of the piezoelectric bar 360.

The operation of the electro-mechanical device 350 is similar to the embodiment described with reference to FIG. 3 except that when voltage 390 is applied to piezoelectric bar 360, the electro-mechanical device 350 will vibrate in direction $D_2$ (i.e., relative to the perspective shown in FIG. 4) due to the orientation of the bimorph piezoelectric bar 360 relative to base member 380.

Figure 5:
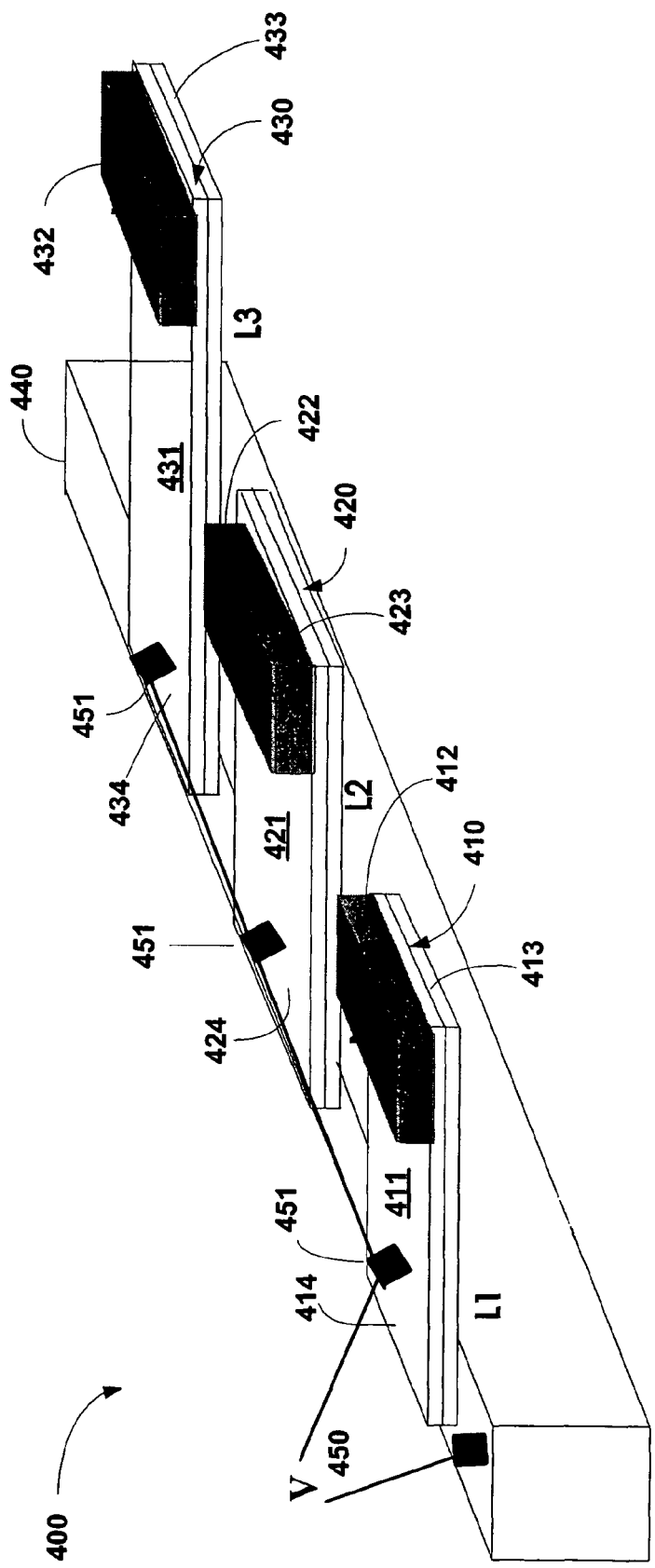
FIG. 5 shows a perspective view of an electro-mechanical transducer in a parallel arrangement, according to an embodiment.

FIG. 5 illustrates an electro-mechanical transducer 400, according to another embodiment. The electro-mechanical transducer 400 includes three electro-mechanical devices 410, 420, and 430. In the illustrated embodiment, each of the electro-mechanical devices 410, 420 and 430 includes a piezoelectric bar 411, 421, and 431, respectively. A mass 412, 422, and 432 can be coupled to an end portion 413, 423, or 433, of each piezoelectric bar 411, 421 and 431, respectively. The second end portion 414, 424, and 434, of each piezoelectric bar 411, 421, and 431, respectively, is coupled to a base member 440. Base member 440 can be configured to remain stationary with respect to movement of the piezoelectric bars 411, 421 and 431. More specifically, base member 440 is stationary relative to any movement of piezoelectric bars 411, 421 and 431, but can move in the context of the overall product or device (e.g., mobile phone, game controller, etc.) with which the electro-mechanical device 400 is disposed. In fact, base member 440 can relay the vibrations produced by the movement of piezoelectric bars 411, 421 and 431 to the product or device. Base member 440 may be a single contiguous mechanical ground, as illustrated in FIG. 5. Alternatively, each piezoelectric bar 411, 421, and 431 may be coupled to a different mechanical ground.

Piezoelectric bars 411, 421, and 431 have lengths L1, L2, and L3, respectively. In one embodiment, these lengths may be the same. Alternatively, lengths L1, L2, and L3 can be different. Additionally, the weights of masses 412, 422, and 432, can be equal to one another. Alternatively, weights of the masses 412, 422, and 432 can be different from one another. The particular configuration of the masses 412, 422 and 432 and the lengths of the piezoelectric bars 411, 421, and 431 can be based on the desired frequency response from the electro-mechanical transducer 400.

The operation of the electro-mechanical transducer in FIG. 5 will be described with reference to FIGS. 4 and 5. Voltage 450 can be applied to the electro-mechanical devices through contacts 451. The voltage may by modulated at approximately the resonant frequency of the electro-mechanical devices 410, 420, and/or 430. The voltage may be applied by a single voltage source via contacts 451, or alternatively, each electro-mechanical device 410, 420, 430, may have an independent voltage source (not shown) that is modulated approximately at the resonant frequency of the respective electro-mechanical device, or a resonant mode of the respective electro-mechanical device. Alternatively, voltage 450 may be modulated at a higher order resonant frequency of the electro-mechanical devices 410, 420, and/or 430.

In an alternative arrangement, the electro-mechanical transducer 400 can include electro-mechanical devices 410, 420, and 430 that have different lengths L1, L2, L3. In this arrangement, each of the electro-mechanical devices 410, 420, and 430 has a different resonant frequency $f_1$, $f_2$ and $f_3$, respectively. These different resonant frequencies can be driven at different drive frequencies $f_1$, $f_2$ and $f_3$. An example of the frequency response for an electro-mechanical transducer 400 is illustrated in FIG. 7. As depicted in the plot in FIG. 7, an electro-mechanical transducer with three electro-mechanical devices each operating at a different resonant frequency (or resonants thereof) has a frequency response with a greater bandwidth than the frequency response for an electro-mechanical transducer having a single electro-mechanical device, which is illustrated in FIG. 7. Note that the gain values shown on the y-axes in FIGS. 6 and 7 relate to the magnitude of the device position divided by the magnitude of the input voltage to the device.

In another arrangement, masses 412, 422, and 432 and lengths L1, L2, and L3 of electro-mechanical devices 411, 421, and 431 can be configured such that a single drive frequency, $f_d$, may be used to drive, for example, the resonant mode in electro-mechanical device 411, the first resonant mode in electro-mechanical device 422, and the second resonant mode in electro-mechanical device 432.

In yet another arrangement, the bandwidth of the electro-mechanical transducer 400 may be adjusted by selectively operating one or more of the electro-mechanical devices 410, 420, 430 in different resonant modes. Each one of these combinations of resonant frequencies collectively superpose into a different operational mode of the electro-mechanical transducer 400.

In a first operational mode, for example, the electro-mechanical transducer 400 can be operated such that electro-mechanical devices 410 and 430 may be operating at frequencies f, and $f_3$, respectively, with $f_1$ and $f_3$ being resonant modes of the electro-mechanical devices 410 and 430, respectively. A voltage need not be applied to electro-mechanical device 420 in this operational mode. In this operational mode, the output of the electro-mechanical transducer 400 would include peaks 510 and 530 illustrated in FIG. 7.

In a second operational mode, for example, the electro-mechanical transducer 400 can be operated such that electro-mechanical devices 410 and 420 are operating at frequencies $f_1$ and $f_2$, respectively, where $f_1$ and $f_2$ are resonant modes of the electro-mechanical devices 410 and 420. In this operational mode, the electro-mechanical transducer 400 can produce an output having only two peaks, as illustrated, for example, in FIG. 7 as 510 and 520. This operational mode can have two frequencies that are different from the two frequencies of the first operational mode described above. Therefore, by changing the operational mode of the electro-mechanical transducer 400, the resultant frequencies of the tactile feedback can be changed.

In a third operational mode, for example, the electro-mechanical transducer 400 can be operated such that electro-mechanical devices 420 and 430 may be operating at frequencies $f_2$ and $f_3$, respectively, where $f_2$ and $f_3$ are resonant modes of each of the electro-mechanical devices 420 and 430. In this operational mode, the electro-mechanical transducer 400 can produce an output having only two peaks, as illustrated, for example, in FIG. 7 as 520 and 530. This operational mode can have two frequencies that are different from the two frequencies for first operational mode described above. Additionally, the third operational mode can have two frequencies that are different from the two frequencies of the second operational mode. Therefore, by changing the operational mode of the electro-mechanical transducer 400, the resultant frequencies of the haptic feedback can be changed.

In other operational modes, the electro-mechanical transducer 400 can be operated such that one of electro-mechanical devices 410, 420 and 430 is operating at frequencies $f_1$, $f_2$ and $f_3$, respectively, where $f_1$, $f_2$ and $f_3$ are resonant modes of each of the electro-mechanical devices 410, 420 and 430. In these operational modes, the electro-mechanical transducer 400 can produce an output having only one peak at a time. In other words, operational modes are possible where only a single electro-mechanical device is actuated at a given time.

The voltage can be modulated at a number of different drive frequencies, $f_d$. For example, the drive frequency $f_d$ can approximate a resonant mode of the electro-mechanical devices. Alternatively, $f_d$ can include any other frequency that is an integral multiple of the electro-mechanical device's resonant frequency.

While certain operational modes have been described with reference to FIG. 5, it will be apparent from this discussion that many other operational modes are possible. For example, by providing additional electro-mechanical devices, the number of possible operational modes increases. Additionally, while only three piezoelectric bars were illustrated in FIG. 5, any number of piezoelectric bars may be employed.

Additionally, while the embodiments were described above with reference to electro-mechanical devices that included piezoelectric bars, any electro-active material or device can be used. For example, the electro-mechanical devices can include electro-active polymers (EAP), voice coil transducers or other electromagnetic device, an inertial resonant device, or a resonant eccentric rotating mass (HERM) device. An example of an inertial resonant device is described in U.S. Pat. No. 6,088,019. An example of a HERM device is described in U.S. Pat. No. 7,161,580.

Figure 8:
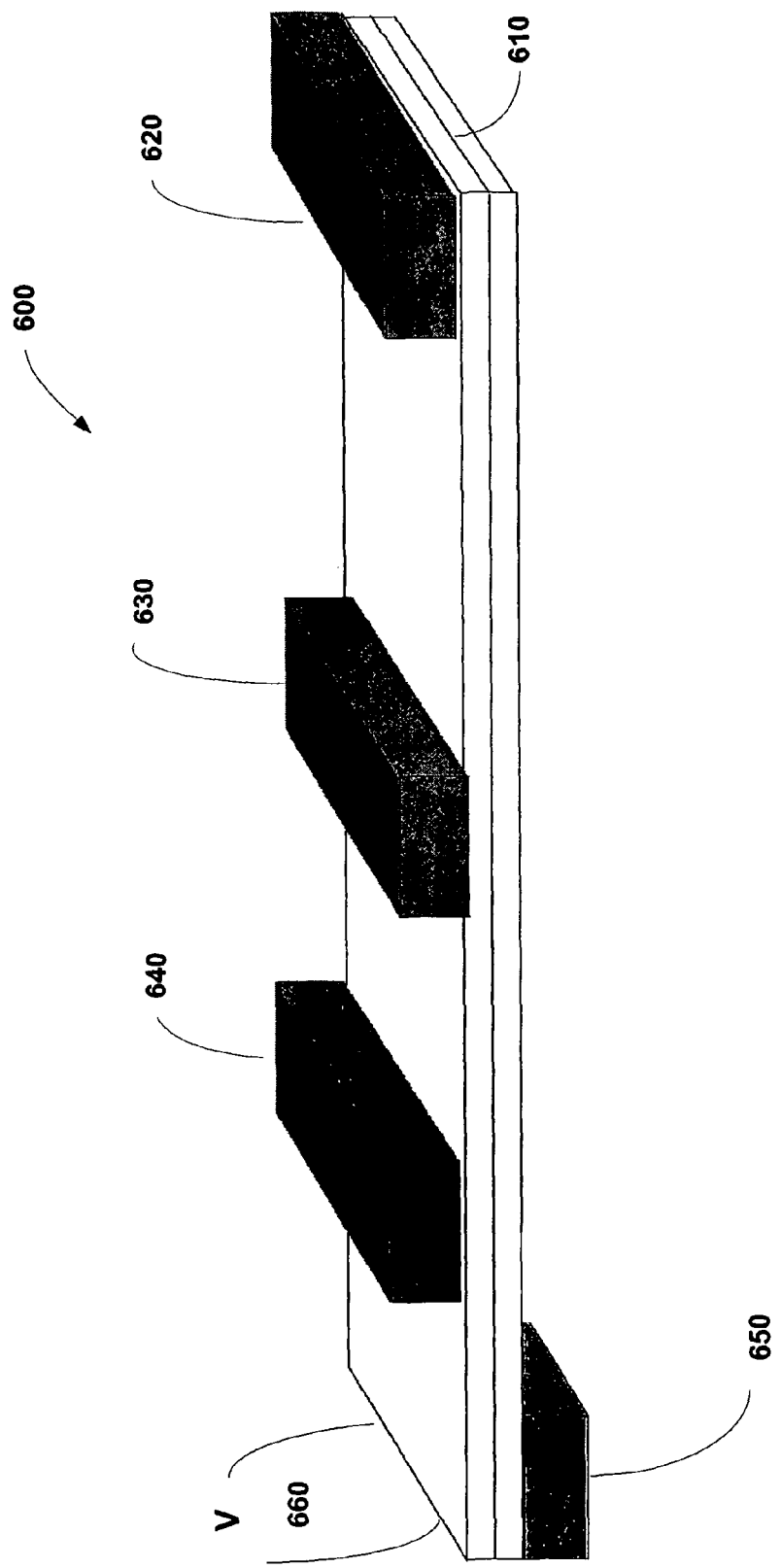
FIG. 8 shows a perspective view of an electro-mechanical transducer in a series arrangement according to another embodiment.

FIG. 8 illustrates an alternative embodiment of an electro-mechanical transducer 600 having multiple masses 620, 630, and 640 disposed on the same piezoelectric bar 610.

In this embodiment, electro-mechanical transducer 600 comprises one electro-mechanical device, the structure of which corresponds to the structure of electro-mechanical transducer 600. The piezoelectric bar 610 is secured to a base member 650, which acts as a mechanical ground and remains substantially fixed with respect to the movement of the electro-mechanical device 600. Masses 620, 630, and 640 can have equal weights or can have different weights. Alternatively, the weights of the two masses can be equal to one another, while the weight of the third mass can be different. Additionally, the masses 620, 630, and 640 can be equally spaced along the length of the piezoelectric bar 610 or can be spaced at any desired location along the length of the piezoelectric bar 610. The weight of and spacing between masses 620, 630, and 640 allow the electro-mechanical device to be designed to have a predetermined number of resonant frequencies.

Next, the operation of the embodiment illustrated in FIG. 8 will be described with reference to FIGS. 6-10. FIGS. 7-10 illustrate an example of the different operational modes that can be obtained with an electro-mechanical transducer 600 bearing three masses. The bends in the piezoelectric bar 610 are exaggerated in this figure to illustrate the bending of the piezoelectric bar 610 more clearly.

Figure 9:
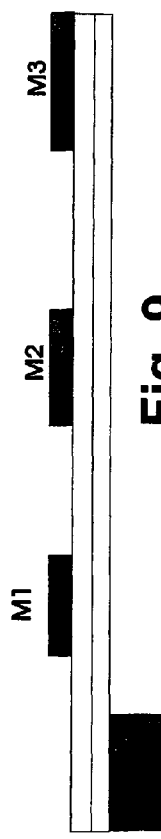
FIG. 9 shows a side view of an electro-mechanical transducer shown in FIG. 8 in a rest position.
Figure 10:
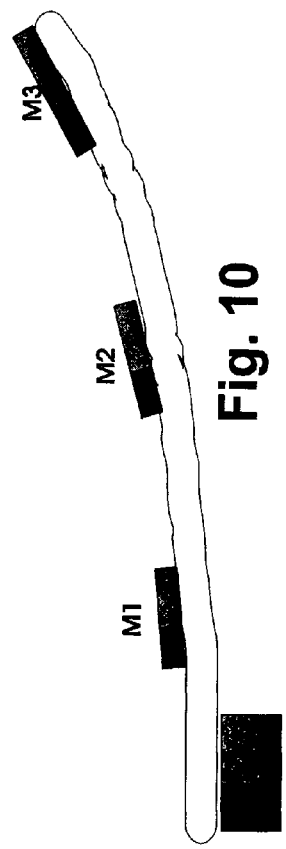
FIG. 10 illustrates the electro-mechanical transducer according to the embodiment depicted in FIG. 8 operating in a first resonant mode.
Figure 11:
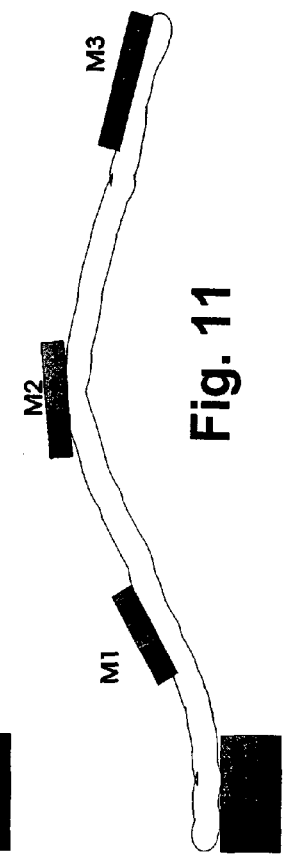
FIG. 11 illustrates the electro-mechanical transducer according to the embodiment depicted in FIG. 8 operating in a second resonant mode.
Figure 12:
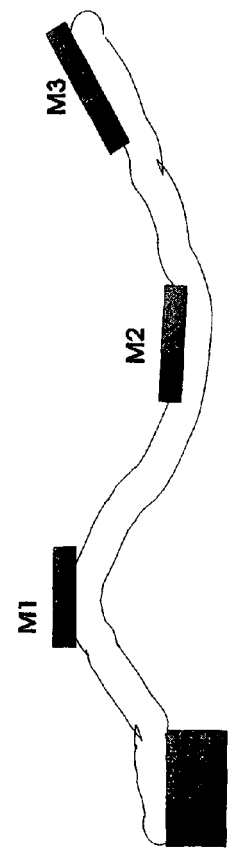
FIG. 12 illustrates the electro-mechanical transducer according to the embodiment depicted in FIG. 8 operating in a third resonant mode.

Frequency modulated voltage can be applied to the piezoelectric bar 610. As illustrated in FIG. 9, the electro-mechanical device is initially in a resting position. FIG. 10 illustrates a first resonant mode of the electro-mechanical device. FIG. 11 illustrates a second resonant mode of the electro-mechanical device. FIG. 12 illustrates a third resonant mode of the electro-mechanical device. The modes illustrated in FIGS. 7-10 will produce a resultant output having frequencies that are similar to the frequencies illustrated in FIG. 7 due to the superposition of the three resonant modes produced by the electro-mechanical device.

Figure 13:
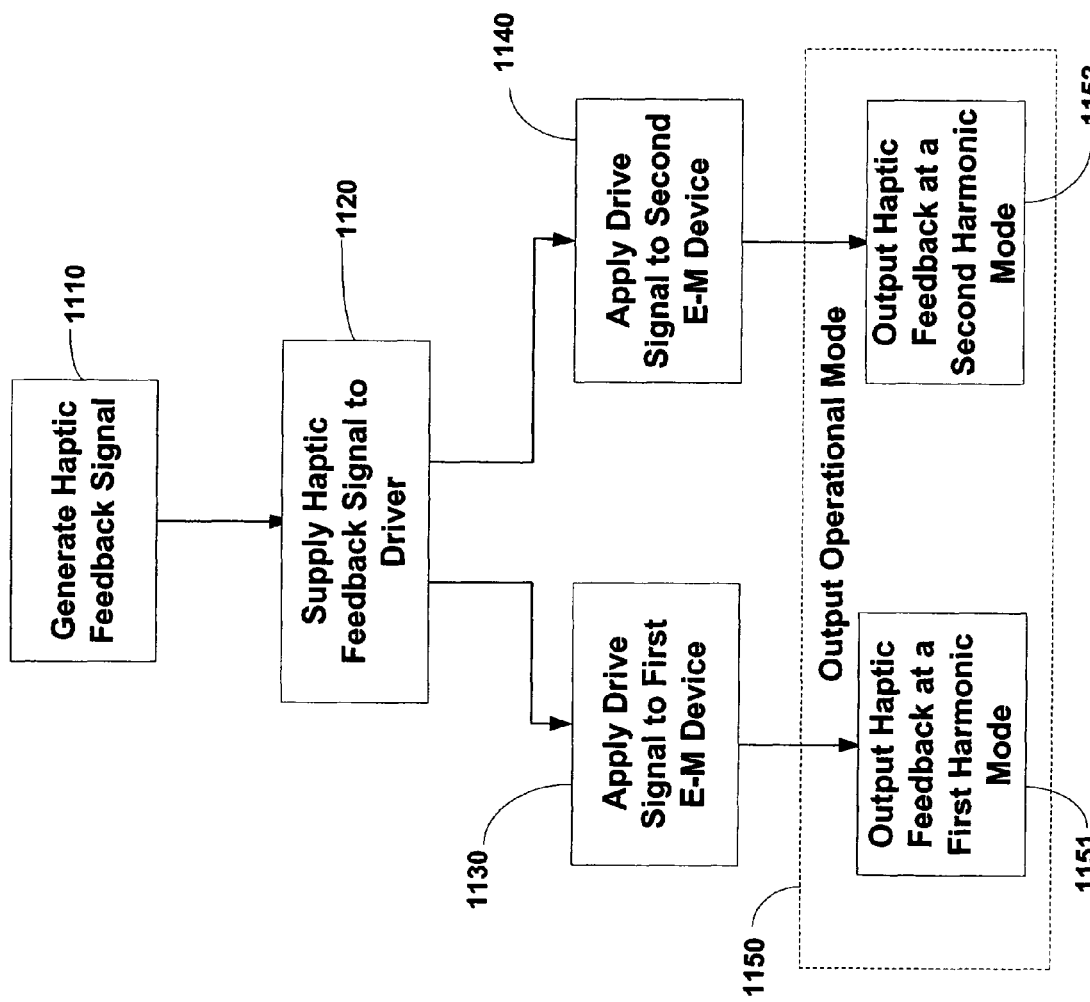
FIG. 13 is a flow chart illustrating a method for producing an operational mode of an electro-mechanical transducer according to an embodiment.

FIG. 13 illustrates a method for producing an operational mode of an electro-mechanical transducer, according to an embodiment. At step 1110, a haptic feedback signal is generated. At step 1120, the haptic feedback signal is supplied to a driver. At step 1130, the drive signal is then applied to a first electro-mechanical device. At step 1140, a drive signal is also applied to the second electro-mechanical device. At step 1150, the electro-mechanical devices output haptic feedback that includes haptic feedback at a first resonant mode (step 1151) and haptic feedback at a second resonant mode (step 1152). The output of haptic feedback at a first resonant mode by a first electro-mechanical device and/or at a second resonant mode by a second electro-mechanical device correspond to an operational mode of the electro-mechanical transducer having the first electro-mechanical device and/or the second electro-mechanical device, respectively.

Additional electro-mechanical devices can be added and can have the drive signal selectively applied thereto to collectively yield a variety of different operational modes of the electro-mechanical transducer. Alternatively, the electro-mechanical transducer may include multiple masses, as illustrated in FIG. 8. By altering the frequency of the drive signal such that it substantially corresponds to the resonant frequencies of the electro-mechanical device, the electro-mechanical transducer can output haptic feedback having multiple frequencies for a given operational mode.

In another embodiment, a number of electro-mechanical devices in a serial configuration, as illustrated in FIG. 8, can be arranged in parallel as illustrated in FIG. 5.

The devices described above are capable of being used in small, portable devices where energy consumption needs to be low. For example, electro-mechanical transducers can be used in cellular phones, electronic pagers, laptop touch pads, a cordless mouse or other computer peripherals whether cordless or otherwise, a personal digital assistant (PDA), along with a variety of other portable and non-portable devices.

While the particular embodiments were described above with respect to piezoelectric bars, they are not limited to the use of piezoelectric bars and piezoelectric devices having various structures can be used depending on the desired application of the electro-mechanical transducer. For example, the piezoelectric device can have a planar shape where the width is approximately the same as the length.

While particular embodiments have been described with reference to piezoelectric ceramics, numerous other electro-mechanical devices may be used. For example, the electro-mechanical devices may include electro-active polymers (EAP), voice coil transducers or other electromagnetic device, or resonant eccentric rotating mass (HERM) devices.

While various embodiments have been described above, it should be understood that they have been presented by way of example only, and not limitation. Thus, the breadth and scope of should not be limited by any of the above-described embodiments, but should be defined only in accordance with the following claims and their equivalence.

The previous description of the embodiments is provided to enable any person skilled in the art to make or use the embodiments. While various electro-mechanical transducers have been described including at least one electro-mechanical device including a piezoelectric substance, various other electro-mechanical devices may be utilized that can be configured to operate in multiple operational modes, each one of the multiple operational modes including a number of resonant modes. Other modifications to the overall structure of the electro-mechanical devices and arrangement of the selector-mechanical transducers can be made without departing from the spirit and scope of the embodiments.

What is claimed is:

1. An electronic device comprising:
   a housing;
   a base coupled to the housing; and
   a plurality of electro-mechanical transducers coupled to the base, each electro-mechanical transducer configured to operate in its respective resonant mode and output a respective haptic effect upon receiving a drive signal having a predetermined drive frequency,
   wherein each electro-mechanical transducer further comprises an electro-mechanical device having a piezoelectric bar and a mass coupled to the piezoelectric bar, the mass of each electro-mechanical device located a predetermined distance from the base.

2. The electronic device of claim 1 wherein at least one mass is located a different predetermined distance from the base than a mass of another electro-mechanical device in the plurality.

3. The electronic device of claim 1 wherein at least one mass has a weight different than a mass of another electro-mechanical device in the plurality.

4. The electronic device of claim 1 wherein the drive frequency of the drive signal applied to two or more of the electro-mechanical transducers in the plurality has a substantially same value.

5. The electronic device of claim 1 wherein the drive frequency of the drive signal applied to at least one electro-mechanical transducer in the plurality is at a higher order of the resonant frequency of another electro-mechanical transducer in the plurality.

6. The electronic device of claim 1 wherein at least one of the electro-mechanical transducers includes a plurality of spaced apart electro-mechanical devices coupled thereto in a serial fashion between a first end proximal to the base and a second end distal to the base.

7. A method of outputting haptic effects from an electronic device, the method comprising:
   applying a drive signal at a predetermined drive frequency to at least one electro-mechanical transducer of a plurality of electro-mechanical transducers coupled to a base in a housing, wherein each electro-mechanical transducer comprises an electro-mechanical device coupled to the base, and wherein each electro-mechanical transducer is configured to operate at a respective resonant mode; and
   outputting a haptic effect from the at least one electro-mechanical transducer,
   wherein each electro-mechanical device of the plurality further comprises a piezoelectric bar having a mass coupled thereto, the mass of each electro-mechanical device located a predetermined distance from the base.

8. The method of claim 7 wherein at least one mass is located a different distance from the base than a mass of another electro-mechanical device in the plurality.

9. The method of claim 7 wherein at least one mass has a weight different than a mass of another electro-mechanical device in the plurality.

10. The method of claim 7 the drive frequency of the drive signal applied to two or more of the electro-mechanical transducers in the plurality has a substantially same value.

11. The method of claim 7 wherein the drive frequency applied to at least one electro-mechanical transducer of the plurality is at a higher order of the resonant frequency of another electro-mechanical transducer in the plurality.

12. The method of claim 7 wherein at least one of the electro-mechanical transducers includes a plurality of spaced apart electro-mechanical devices coupled thereto in a serial fashion between a first end proximal to the base and a second end distal to the base.

13. The method of claim 7 further comprising:
   selectively applying the drive signal to a first electro-mechanical transducer and a second electro-mechanical transducer to operate the first and second electro-mechanical transducers at their respective resonant mode frequencies in a first operational mode to collectively output a first haptic effect; and
   selectively applying the drive signal to the first electro-mechanical transducer and a third electro-mechanical transducer to operate the first and third electro-mechanical transducers at their respective resonant mode frequencies in a second operational mode to collectively output a second haptic effect.

14. An electronic device comprising:
   a housing;
   a base coupled to the housing; and
   an electro-mechanical transducer coupled to the base, the electro-mechanical transducer configured to operate in a resonant mode and output a haptic effect upon receiving a drive signal at a predetermined drive frequency, wherein the electro-mechanical transducer comprises a piezoelectric bar and a mass coupled to the piezoelectric bar.

15. The electronic device of claim 14, wherein the housing is of a mobile telephone device.

16. The electronic device of claim 14, wherein the housing is of a video game controller.

17. The electronic device of claim 14, wherein the base imparts the haptic effect to the housing such that a user grasping the housing feels the haptic effect.

18. The electronic device of claim 14, wherein the electro-mechanical transducer further comprises a plurality of electro-mechanical devices arranged in a parallel fashion with respect to the base, each electro-mechanical device including a piezoelectric bar and a mass coupled to the piezoelectric bar, the mass of each electro-mechanical device located a respective predetermined distance from the base.

19. An electronic device comprising:
   a housing;
   a base coupled to the housing; and
   an electro-mechanical transducer coupled to the base, the electro-mechanical transducer configured to operate in a resonant mode and output a haptic effect upon receiving a drive signal at a predetermined drive frequency,
   wherein the electro-mechanical transducer further comprises a plurality of spaced apart electro-mechanical devices coupled thereto in a serial fashion between a first end proximal to the base and a second end distal to the base.

20. The electronic device of claim 19, wherein each of the plurality of spaced apart electro-mechanical devices is configured to operate in its respective resonant mode and output a respective haptic effect upon receiving a drive signal having a predetermined drive frequency.

* * * * *